(12) United States Patent
Chu et al.

(10) Patent No.: US 11,373,945 B2
(45) Date of Patent: Jun. 28, 2022

(54) ELECTRONIC DEVICE

(71) Applicant: InnoLux Corporation, Miao-Li County (TW)

(72) Inventors: Wei-Cheng Chu, Miao-Li County (TW); Chih-Yuan Lee, Miao-Li County (TW); Yun-Chih Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 125 days.

(21) Appl. No.: 16/899,780

(22) Filed: Jun. 12, 2020

(65) Prior Publication Data
US 2021/0013131 A1    Jan. 14, 2021

(30) Foreign Application Priority Data
Jul. 8, 2019    (CN) .......................... 201910610258.6

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/498* | (2006.01) | |
| *H05K 1/11* | (2006.01) | |

(52) U.S. Cl.
CPC .... *H01L 23/4985* (2013.01); *H01L 23/49838* (2013.01); *H05K 1/118* (2013.01)

(58) Field of Classification Search
CPC combination set(s) only.
See application file for complete search history.

(56) References Cited

U.S. PATENT DOCUMENTS

| | | | | |
|---|---|---|---|---|
| 2007/0166881 | A1* | 7/2007 | Liu | H01L 24/11 |
| | | | | 257/E23.021 |
| 2009/0001567 | A1 | 1/2009 | Shih et al. | |
| 2013/0228930 | A1* | 9/2013 | Ono | H01L 21/50 |
| | | | | 257/762 |
| 2013/0334684 | A1* | 12/2013 | Lin | H01L 21/563 |
| | | | | 257/737 |

FOREIGN PATENT DOCUMENTS

| | | | |
|---|---|---|---|
| CN | 1558270 A | 12/2004 | |
| JP | H09162230 A | * 6/1997 | ............. H01L 24/92 |

* cited by examiner

*Primary Examiner* — Niki H Nguyen
(74) *Attorney, Agent, or Firm* — McClure, Qualey & Rodack, LLP (57) ABSTRACT

An electronic device includes a substrate, a first conductive pad and a chip. The first conductive pad is disposed on the substrate. The chip includes a second conductive pad electrically connected to the first conductive pad, and the first conductive pad is disposed between the substrate and the second conductive pad. The first conductive pad has a first groove.

18 Claims, 11 Drawing Sheets

ELECTRONIC DEVICE

CROSS REFERENCE TO RELATED APPLICATIONS

This application claims priority of China Patent Application No. 201910610258.6, filed Jul. 8, 2019, the entirety of which is incorporated by reference herein.

BACKGROUND

Field of the Invention

The present invention relates to an electronic device, and in particular to an electronic device having a chip and a conductive pad bonded to the chip.

Description of the Related Art

Electronic devices include a chip that may be bonded onto a substrate (such as the substrate of the panel or the substrate of the flexible circuit board). The signals providing from the chip are transmitted to the substrate of the panel or the substrate of the flexible circuit board via conductive pads disposed on the substrate. Therefore, how to increase the adhesion between the chip and the conductive pad has become an important topic of discussion.

BRIEF SUMMARY

Some embodiments of the disclosure provide an electronic device, including a substrate, a first conductive pad and a chip. The first conductive pad is disposed on the substrate. The chip comprises a second conductive pad electrically connected to the first conductive pad, and the first conductive pad is disposed between the substrate and the second conductive pad. The first conductive pad has a first groove.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

Various embodiments or examples are provided in the following description to implement different features of the present disclosure. The element and arrangement described in the following specific examples merely provided for briefly present the present and serve as examples without limiting the scope of the present disclosure. For example, when a first component is referred to as "on a second component", it may directly contact the second component, or there may be other components in between, so that the first component and the second component do not directly contact. When the first component is referred to as "electrically connected to the second component", it may be electrically connected to the second component directly, or it may be electrically connected to the second component via other components.

The present disclosure may be understood referring to the following description and the appended drawings. It is noted that for the sake of the comprehensibility and the simplicity of the drawings for the readers, only a portion of the electronic device is illustrated in multiple figures in the present disclosure, and the specific component in the figures are not drawn to scale. In addition, the number and size of each component in the drawings merely serve as an example, but are not intended to limit the scope of the present disclosure.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "containing", "having" and the like are open words, so they should be interpreted as meaning "including but not limited to . . . ."

Furthermore, same numerals and/or wordings may be used in different embodiments herein. These repetitions are merely for simplicity and clarity, but not intended to represent any relationship between different embodiments and settings.

Although the terms "first," "second," "third," etc. may be used to describe various components, however, these components are not limited to the above terms. These terms are provided for distinguish single component and other components in the specification. The same terms may not be used in the appended claims, and be replaced with first, second, third, etc. depending on the order of the component shown in the claims. Therefore, a first component in the specification may become a second component in the claims.

In this specification, spatial terms may be used, such as "higher" or "lower," for briefly describing the relationship between an element relative to another element in the figures. Besides the directions illustrated in the figures, the devices may be used or operated in different directions. In addition, the shapes, sizes and thickness in the figures may be not drawn to scale or be simplified for illustration.

The terms "about," "substantially" or "approximately" are generally interpreted as within 20%, 10%, or 5% of a given value or range. The given amount herein is an approximate value. That is, even if not specifically described, it still implies the meaning of "about," "substantially," "approximately," etc.

Figure 1:
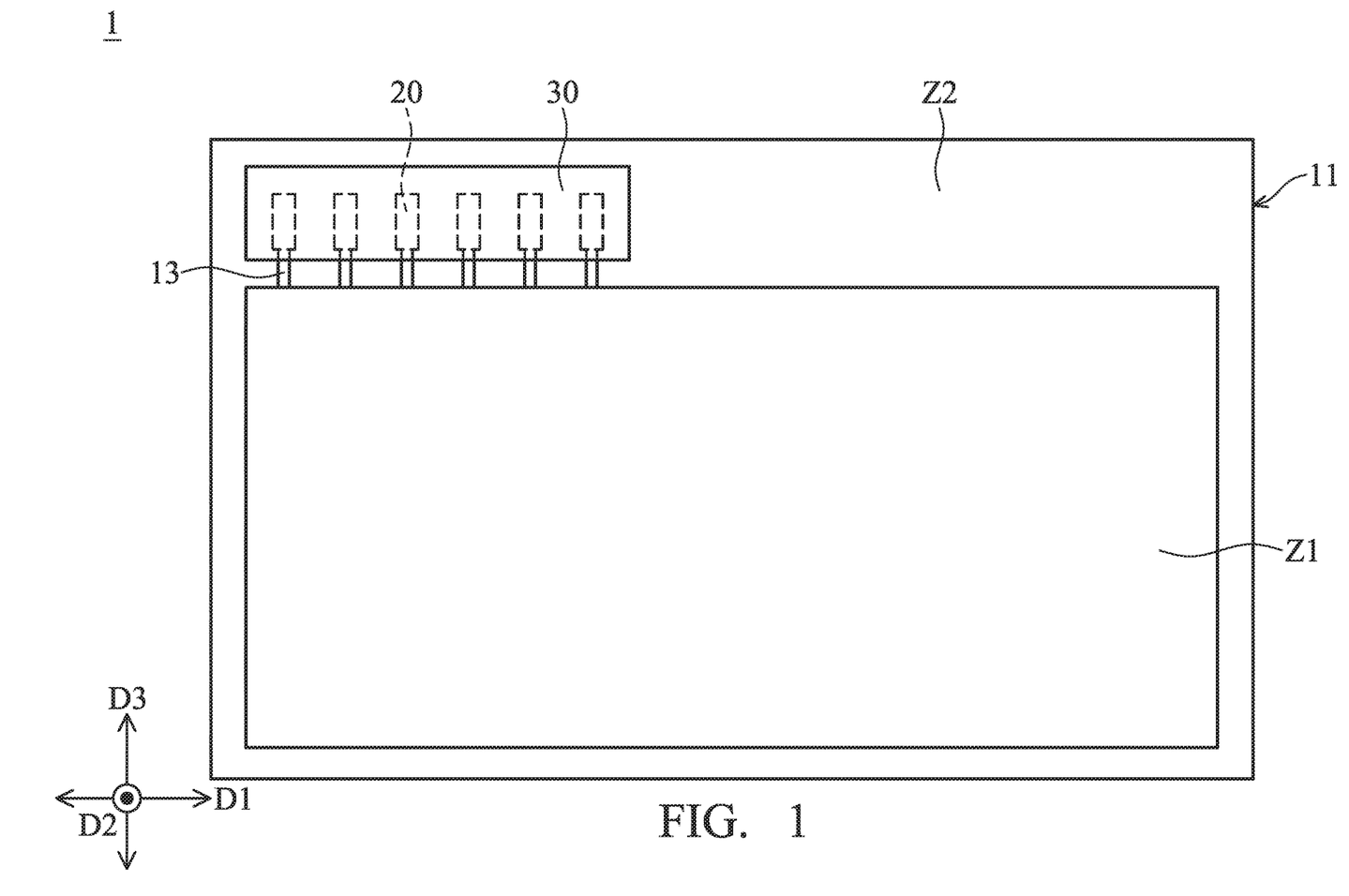
FIG. 1 is a top view illustrating an electronic device in accordance with some embodiments of the present disclosure.

FIG. 1 is a top view illustrating an electronic device 1 in accordance with some embodiments of the present disclosure. It should be noted that the electronic device 1 may include a television, a computer, a tablet, a smart phone, an automotive panel, a touch display, a public display, an antenna, a sensing device or another electronic device, but it is not limited thereto. The electronic device may include a liquid-crystal, light-emitting diode, a light-emitting diode (LED), an organic light-emitting diode (OLED), a micro LED, a mini LED, quantum dot (QD) light-emitting diode (which may be referred to as QD-LED, QLED), a fluorescence material, a color filter material, a phosphor material, other suitable materials or a combination thereof, but it is not limited thereto. In some embodiments, the electronic device may be active matrix LED (AM-LED) or passive matrix LED (PM-LED).

The electronic device 1 may comprise a substrate 11, one (or more) first conductive pad 20 and a chip 30. The first conductive pad 20 is disposed on the substrate 11. The substrate 11 may be an array substrate or a circuit board, but it is not limited thereto. The substrate 11 of the electronic device 1 includes a flexible circuit board (such as chip on film (COF)) or a rigid circuit board, but it is not limited thereto. The material of the substrate 11 may include glass, quartz, metal, ceramic, organic polymers, plastic, other suitable material or a combination thereof, but it is not limited thereto. The material of the substrate 11 may include polyimide (PI), polyethylene terephthalate (polyethylene terephthalate, PET), polycarbonate (polycarbonate, PC), other suitable materials, or a combination thereof, but it is not limited thereto. In some embodiments, the substrate 11 is an array substrate. The substrate 11 may be divided into an operation area Z1 and a non-operation area Z2. The non-operation area Z2 is adjacent to or surrounds the operation area Z1, but it is not limited thereto. In some embodiments, the non-operation area Z2 is located on at least one side of the operation area Z1. The operation area Z1 includes a display area, a detection area, a light-emitting area or another suitable operation area, but it is not limited thereto. The non-operation area Z2 is a circuit area, but it is not limited thereto. In some embodiments, a plurality of first conductive pads 20 may be disposed on the substrate 11 and correspond to the non-operation area Z2, and a plurality of signal lines 13 and a plurality of pixels (not shown) may be disposed on the substrate 11. The signal lines 13 are electrically connected to the first conductive pads 20 respectively, and the first conductive pads 20 are electrically connected to the pixels respectively (for example, the transistors of the pixels) via the signal lines 13. In some embodiments, the signal lines 13 include a scanning line, a data line or a reading line, but they are not limited thereto. It should be noted that the numbers of the first conductive pads 20 and the signal lines 13 in the drawings are illustrated as an example, but not provided as a limitation. It is noted that the size of the components in the drawings are shown for illustration, and these components are enlarged in order to make the first conductive pads 20, the chip 30, and the signal lines 13 is clearer.

In some embodiments, the chip 30 is disposed or bonded on the substrate 11, for example. More specifically, the chip 30 comprises a second conductive pad (not shown in FIG. 1, but may be referred to the second conductive pads 32 in FIG. 2), and at least a portion of the second conductive pad 32 overlaps the first conductive pad 20 of the substrate 11 in a normal direction D2 of the substrate 11, the second conductive pad 32 of the chip 30 may be electrically connected to the first conductive pad 20. In some embodiments, the chip 30 may include a driving chip, which includes a scanning chip, a data chip or another suitable chip, but it is not limited thereto. In some embodiments, the electronic device 1 includes at least one chip 30, but it is not limited thereto.

Figure 2:
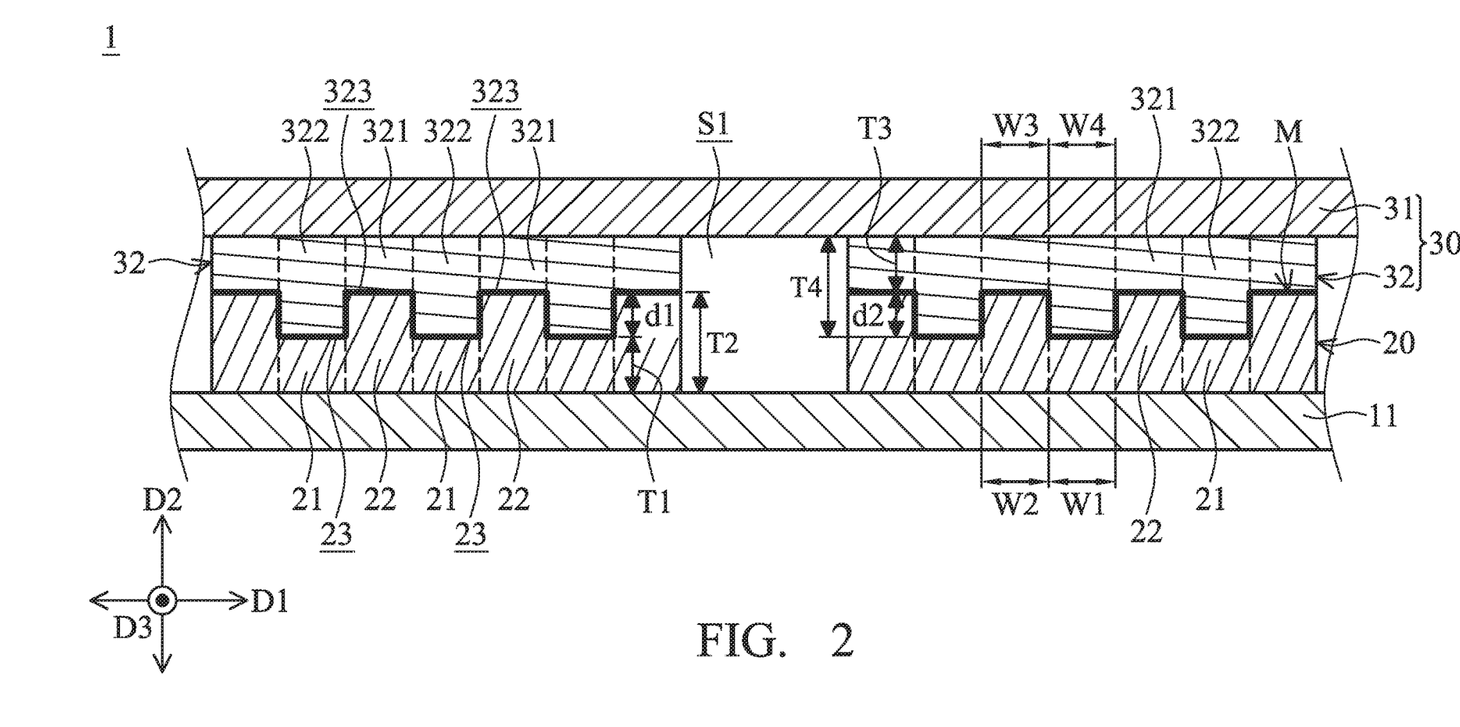
FIG. 2 is a schematic view illustrating the electronic device in accordance with a first embodiment of the present disclosure.

FIG. 2 is a schematic view illustrating the electronic device 1 in accordance with a first embodiment of the present disclosure. The chip 30 includes a base 31 and one (or more) second conductive pad 32. Other circuits (not shown) may be disposed on the base 31, but in order to make the drawings simpler or clearer, the base 31 is illustrated as a flat structure. The second conductive pad 32 is disposed on the base 31 and electrically connected to other circuits. The chip 30 may be electrically connected to the first conductive pad 20 via the second conductive pad 32. In some embodiments, the second conductive pad 32 may directly contact or indirectly contact the first conductive pad 20. In some embodiments, the first conductive pad 20 is disposed between the substrate 11 and the second conductive pad 32. The second conductive pad 32 is disposed correspondingly on the first conductive pad 20, and the first conductive pad 20 substantially overlaps with the second conductive pad 32 may in the normal direction D2 of the substrate 11. In some embodiments, a plurality of first conductive pads 20 are arranged or disposed in a direction D1, and a plurality of second conductive pads 32 are arranged or disposed in the direction D1, for example.

In some embodiments, the material of the first conductive pad 20 may be the same as or different from the material of the second conductive pad 32. The materials of the first conductive pad 20 and the second conductive pad 32 may include metal materials, transparent conductive materials or a combination thereof. The material of the first conductive pad 20 and/or the second conductive pad 32 may include copper (Cu), aluminum (Al), titanium (Ti), gold (Au), tin (Sn), silver (Ag), molybdenum (Mo), silicon (Si), indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), other suitable materials or a combination thereof, but it is not limited thereto. In some embodiments, the first conductive pad 20 and/or the second conductive pad 32 may include a single conductive layer or multiple conductive layers. In some embodiments, the first conductive pad 20 and/or the second conductive pad 32 include at least two conductive layers. The at least two conductive layers may be in direct contact and electrically connected to each other. For example, at least one insulating layer (not shown) may be disposed between the at least two conductive layers, and the at least two conductive layers are in contact and electrically connected through the opening of the insulating layer, but they are not limited thereto. In some embodiments, the first conductive pad 20 may be a molybdenum-aluminum-molybdenum alloy layer, and a transparent conductive layer disposed on the molybdenum-aluminum-molybdenum alloy layer, and at least one insulating layer is located between the molybdenum-aluminum-molybdenum alloy layer and the transparent conductive layer. The insulating layer has an opening to expose a portion of the upper surface of the molybdenum-aluminum-molybdenum alloy layer. The transparent conductive layer may be in contact with and electrically connected to the molybdenum-aluminum-molybdenum alloy layer through this opening, but it is not limited thereto.

In some embodiments (FIG. 2), the first conductive pad 20 has a (or at least one) first portion 21 and a (or at least one) second portion 22. For example, in the cross-sectional view of FIG. 2, the first portion 21 and the second portion 22 may be staggered along the direction D1, but they are not limited thereto.

In some embodiments, the thickness T2 of the second portion 22 is greater than the thickness T1 of the first portion 21, wherein the thickness T1 of the first portion 21 is defined by a minimum thickness of the first portion 21 in the normal direction D2 of the substrate 11, and the thickness T2 of the second portion 22 is defined by a maximum thickness of the second portion 22 in the normal direction D2 of the substrate 11. In some embodiments, the first conductive pad 20 has a plurality of conductive layers. When these conductive layers include at least two conductive layers, the minimum thickness between the bottom surface of the lowermost conductive layer of the first portion 21 and the upper surface of the uppermost conductive layer in the normal direction D2 of the substrate 11 is defined as the thickness T1 of the first portion 21. In addition, the maximum thickness between the bottom surface of the lowermost conductive layer and the upper surface of the uppermost conductive layer in the normal direction D2 of the substrate 11 is defined as the thickness T2 of the second portion 22. In other words, the first conductive pad 20 has a (or at least one first groove 23), the first groove 23 faces the second conductive pad 32, and the first groove 23 is formed between two adjacent second portions 22 and a first portion 21. For example, the first groove 23 overlaps with the first portion 21 in the normal direction D2 of the substrate 11, and the depth d1 of the first groove 23 may be the thickness T2 of the second portion 22 minus the thickness T1 of the first portion 21. The depth d1 of the first groove 23 is defined by a maximum depth of the first groove 23 in the normal direction D2 of the substrate 11. It should be noted that, when the first conductive pad 20 has multiple conductive layers and at least one insulating layer is disposed between the conductive layers, the first groove 23 is defined by a groove of the uppermost conductive layer (i.e. the conductive layer that is closest to the second conductive pad 32) of the first conductive pad 20. It should be noted that, when the first conductive pad 20 has multiple conductive layers, and different conductive layers are in direct contact each other (that is, no other insulating layer is disposed between the different conductive layers), the first groove 23 is defined by the groove of the conductive layers of the first conductive pad 20. It should be noted that, when the first conductive pad 20 is a single conductive layer, the first groove 23 is defined by the groove of the first conductive pad 20. In some embodiments, the ratio of the thickness T2 of the second portion 22 to the thickness T1 of the first portion 21 is from 1 to 4 ($1<T2/T1\leq4$), but it is not limited thereto. In some embodiments, the ratio of the thickness T2 of the second portion 22 to the thickness T1 of the first portion 21 is from 1.5 to 3 ($1.5\leq T2/T1\leq3$). In some embodiments, the ratio of the thickness T2 of the second portion 22 to the thickness T1 of the first portion 21 is from 1 to 2 ($1<T2/T1\leq2$). In some embodiments, the thickness T2 of the second portion 22 is in a range from 0.3 μm to 5 μm ($0.3\ \mu m\leq T2\leq5\ \mu m$), but it is not limited thereto. In some embodiments, the thickness T2 of the second portion 22 is in a range from 0.5 μm to 2 μm ($0.5\ \mu m\leq T2\leq2\ \mu m$). In some embodiments, the thickness T2 of the second portion 22 is in a range from 0.3 μm to 1.5 μm ($0.5\ \mu m\leq T2\leq1.5\ \mu m$).

In some embodiments, the depth d1 of the first groove 23 is less than the thickness T2 of the second portion 22, and the ratio of the depth d1 of the first groove 23 to the thickness T2 of the second portion 22 is in a range from 0.1 to 1 ($0.1<d1/T2<1$). In some embodiments, the ratio of the depth d1 of the first groove 23 to the thickness T2 of the second portion 22 is in a range from 0.2 to 1 ($0.2<d1/T2<1$). In some embodiments, the ratio of the depth d1 of the first groove 23 to the thickness T2 of the second portion 22 is in a range from 0.5 to 1 ($0.5<d1/T2<1$). In some embodiments, the ratio of the depth d1 of the first groove 23 to the thickness T2 of the second portion 22 is in a range from 0.7 to 1 ($0.7<d1/T2<1$).

It should be noted that the thickness or depth of the above-mentioned or subsequent layers (or portions or components) may be measured by a scanning electron microscope (SEM). For example, SEM image under the cross-section of the layers (or components) may be photographed, and the thickness or the depth may be obtained by measuring the maximum thickness, minimum thickness, and maximum depth of the layer (or portion or component) as defined above in the SEM image, or may be obtained by other suitable measurement method.

In some embodiments, the second conductive pad 32 has a (or at least one) third portion 321 and a (or at least one) fourth portion 322. In FIG. 2, the third portions 321 and the fourth portions 322 may be staggered along the direction D1, but they are not limited thereto.

In some embodiments, the thickness T4 of the fourth portion 322 is greater than the thickness T3 of the third portion 321. The thickness T3 of the third portion 321 is defined by a minimum thickness of the third portion 321 in the normal direction D2 of the substrate 11, and the thickness T4 of the fourth portion 322 is defined by a maximum thickness of the fourth portion 322 in the normal direction D2 of the substrate 11. In some embodiments, the second conductive pad 32 has multiple conductive layers, for example at least two conductive layers. The minimum thickness between the bottom surface (e.g. the surface that is adjacent to the base 31) of the lowermost conductive layer of the third portion 321 and the upper surface (for example, the surface adjacent to the first conductive pad 20) of the uppermost conductive layer of the third portion 321 in the normal direction D2 of the substrate 11 is defined as the thickness T3 of the third portion 321. In addition, the maximum thickness between the bottom surface of the lowermost conductive layer of the fourth portion 322 and the upper surface of the uppermost conductive layer of the fourth portion 322 in the normal direction D2 of the substrate 11 is defined as the thickness T4 of the fourth portion 322. In other words, the second conductive pad 32 has, for example, at least one second groove 323. The second groove 323 faces the first conductive pad 20, and the second groove 323 is formed between two adjacent fourth portions 322 and the third portion 321. In some embodiments, the second groove 323 overlaps with the third portion 321 in the normal direction D2 of the substrate 11. In some embodiments, the first groove 23 overlaps with the fourth portion 322 in the normal direction Z of the substrate 11. The depth d2 of the second groove 323 may be the thickness T4 of the fourth portion 322 minus the third portion 321 of the thickness T3. The depth d2 of the second groove 323 is defined by a maximum depth of the second groove 323 in the normal direction D2 of the substrate 11. It should be noted that, when the second conductive pad 32 has multiple conductive layers, at least one insulating layer may be disposed between different conductive layers. The second groove 323 is defined by the uppermost conductive layer (i.e. the groove closest to the conductive layer of the first conductive pad 20) of the second conductive pad 32. It should be noted that, when the second conductive pad 32 has multiple conductive layers, and there is direct contact between different conductive layers each other (that is, no other insulating layer is disposed between the different conductive layers), the second groove 323 is defined by the groove of the multiple conductive layers of the second conductive pad 32. It should be noted that, when the second conductive pad 32 is a single-layer structure, the second groove 323 is defined by the groove of the second conductive pad 32.

In some embodiments, the ratio of the thickness T4 of the fourth portion 322 to the thickness T3 of the third portion 321 is in a range from 1 to 4 ($1<T4/T3<4$). In some embodiments, the ratio of the thickness T4 of the fourth portion 322 to the thickness T3 of the third portion 321 is in a range from 1.5 to 3 ($1.5<T4/T3<3$). In some embodiments, the ratio of the thickness T4 of the fourth portion 322 to the thickness T3 of the third portion 321 is in a range from 1 to 2 ($1<T4/T3<2$). In some embodiments, the thickness T4 of the fourth portion 322 is in a range from 3 μm to 15 μm ($3\ \mu m \leq T4 \leq 15\ \mu m$). In some embodiments, the thickness T4 of the fourth portion 322 is in a range from 5 μm to 15 μm ($5\ \mu m \leq T4 \leq 15\ \mu m$). In some embodiments, the thickness T4 of the fourth portion 322 is in a range from 5 μm to 10 μm ($5\ \mu m \leq T4 \leq 10\ \mu m$). In some embodiments, the thickness T4 of the fourth portion 322 may be greater than or equal to the thickness T2 of the second portion 22. In some embodiments, the ratio of the thickness T4 of the fourth portion 322 to the thickness T2 of the second portion 22 is in a range from 1 to 35 ($1 \leq T4/T2 \leq 35$), but it is not limited thereto. In some embodiments, the ratio of the thickness T4 of the fourth portion 322 to the thickness T2 of the second portion 22 is in a range from 2 to 30 ($2 \leq T4/T2 \leq 30$). In some embodiments, the ratio of the thickness T4 of the fourth portion 322 to the thickness T2 of the second portion 22 is in a range from 1 to 3 ($1 \leq T4/T2 \leq 3$).

In some embodiments, the depth d2 of the second groove 323 is less than the thickness T4 of the fourth portion 322. In some embodiments, the ratio of the depth d2 of the second groove 323 to the thickness T4 of the fourth portion 322 is in a range from 0.1 to 1 ($0.1<d2/T4<1$), but it is not limited thereto. In some embodiments, the ratio of the depth d2 of the second groove 323 to the thickness T4 of the fourth portion 322 is in a range from 0.2 to 1 ($0.2<d2/T4<1$). In some embodiments, the ratio of the depth d2 of the second groove 323 to the thickness T4 of the fourth portion 322 is in a range from 0.5 to 1 ($0.5<d2/T4<1$). In some embodiments, the ratio of the depth d2 of the second groove 323 to the thickness T4 of the fourth portion 322 is in a range from 0.7 to 1 ($0.7<d2/T4<1$).

In some embodiments, as shown in FIG. 2, in the normal direction D2 of the substrate 11, the fourth portion 322 overlaps with the first portion 21, and the third portion 321 overlaps with the second portion 22. In other words, part of the fourth portion 322 is located in the first groove 23, and part of the second portion 22 is located in the second groove 323. In some embodiments, the second groove 323 overlaps with the second portion 22 in the normal direction Z of the substrate 11. In some embodiments, the width W4 of the fourth portion 322 is less than the width W1 of the first portion 21. In some embodiments, the width W2 of the second portion 22 is less than the width W3 of the third portion 321. In other words, in some embodiments, the width W4 of the fourth portion 322 may be less than the width of the first groove 23, and the width W2 of the second portion 22 may be less than the width of the second groove 323. In some embodiments, the difference between the width of the first groove 23 and the width W4 of the fourth portion 322 is in a range from 0 μm and 14 μm ($0\ \mu m<\Delta W \leq 14\ \mu m$). In some embodiments, the difference between the width of the first groove 23 and the width W4 of the fourth portion 322 is in a range from 0 μm to 7 μm ($0\ \mu m<\Delta W \leq 7\ \mu m$). In some embodiments, the difference between the width of the second groove 323 and the width W2 of the second portion 22 is in a range from 0 μm to 14 μm ($0\ \mu m<\Delta W \leq 14\ \mu m$). In some embodiments, the difference between the width of the second groove 323 and the width W2 of the second portion 22 is in a range from 0 μm to 7 μm ($0\ \mu m<\Delta W \leq 7\ \mu m$). The comparison of the above width W1, width W2, width W3 and width W4 must be compared in the same direction, for example, in any direction (including direction D1 or direction D3) that is perpendicular to the normal direction D2 of the substrate 11. The direction D3 is perpendicular to the normal direction D2 and the direction D1 of the substrate 11, but it is not limited thereto. The width W1 of the first portion 21, the width W2 of the second portion 22, the width W3 of the third portion 321, and the width W4 of the fourth portion 322 are the maximum width of any of the above portions in any direction that is perpendicular to the normal direction D2 of the substrate 11. The above width can be obtained in an optical microscopy (OM) image, and measuring the maximum width of the layer in the optical microscopy image, or can be measured by other suitable measurement methods.

In some embodiments, the first groove 23 of the first conductive pad 20 and the second groove 323 of the second conductive pad 32 are misaligned. In other words, in the normal direction D2 of the substrate 11, the first groove 23 does not overlap with the second groove 323 in the normal direction D2 of the substrate 11. In some embodiments, a projection area of the fourth portion 322 projected onto the substrate 11 is less than a projection area of the first groove 23 projected onto the substrate 11. In some embodiments, the projection area of the second portion 22 projected onto the substrate 11 is less than the projection area of the second groove 323 projected onto the substrate 11. In some embodiments, the shape of the projection area of the fourth portion 322 of the second conductive pad 32 projected onto the substrate 11 may have substantially the same or a corresponding shape as the projection area of the first groove 23 projected onto the substrate 11. In addition, the shape of the projection area of the second portion 22 of the first conductive pad 20 projected onto the substrate 11 may have substantially the same or a corresponding shape as the projection area of the second groove 323 projected onto the substrate 11. In some embodiments, the structure of the first conductive pad 20 is complementary to the structure of the second conductive pad 32. That is, the groove of the first conductive pad 20 corresponds to the protrusion of the second conductive pad 32, and the protrusion of the first conductive pad 20 corresponds to the groove of the second conductive pad 32. The structural design of the first conductive pad 20 and the second conductive pad 32 may increase the adhesion between the chip 30 and the substrate 11, or increase the conductivity between the chip 30 and the substrate 11.

Figure 3:
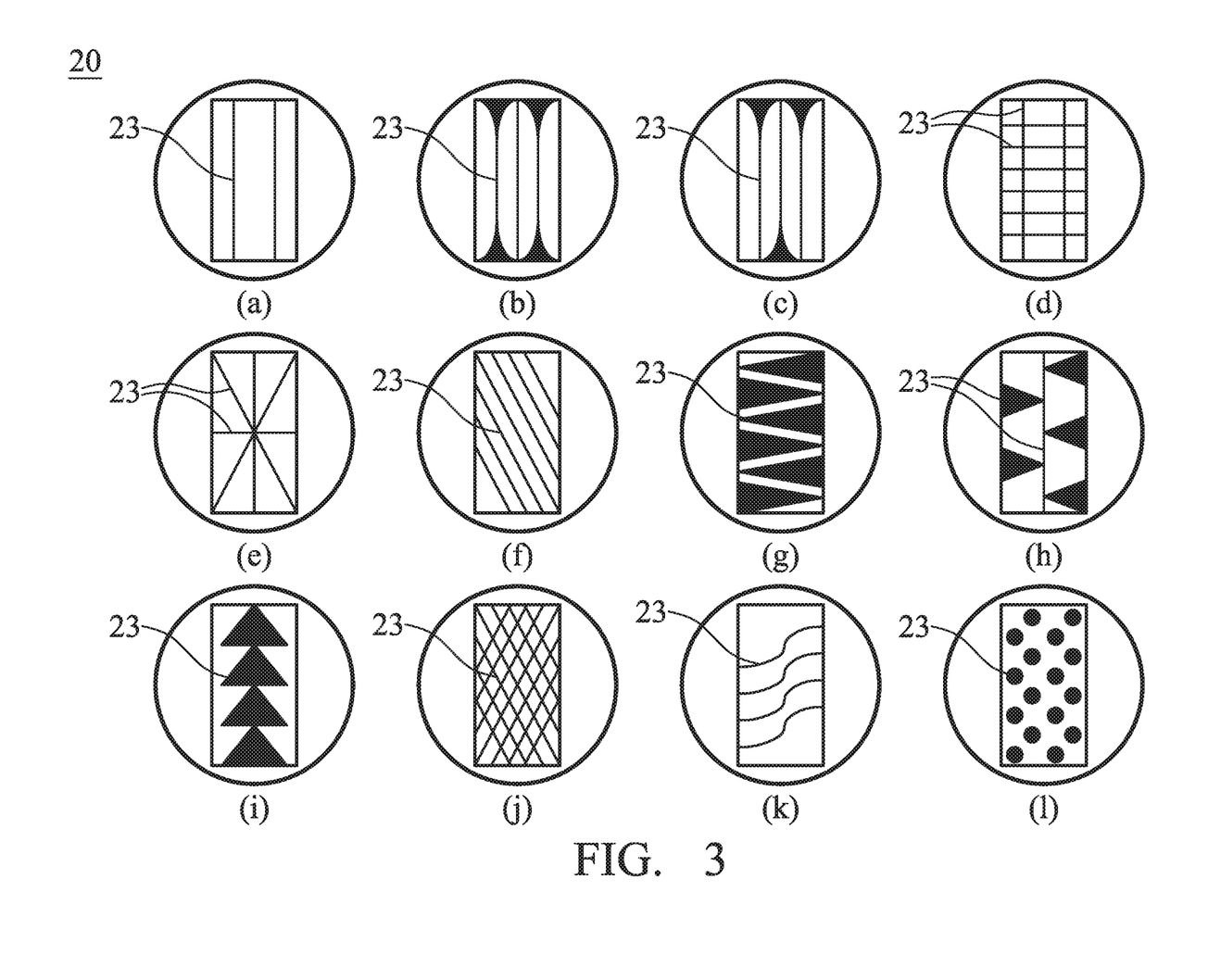
FIG. 3 is a top view illustrating the first conductive pad in accordance with various embodiments of the present disclosure.

FIG. 3 is a top view illustrating various embodiments of the first conductive pad 20 in accordance with the present disclosure. In the normal direction D2 of the substrate 11, the shape of the first groove 23 (such as the black portion shown in FIG. 4) may include lines, grids, curves, circles, polygons, other suitable shapes, or a combination thereof, but it is not limited thereto. In some embodiments, the first groove 23 may have a continuous shape or a discontinuous shape. The above-mentioned first groove 23 has a discontinuous shape. For example, the first conductive pad 20 has a plurality of first grooves 23. In some embodiments, the second groove 323 may have a continuous shape or a discontinuous shape. The above-mentioned second groove 323 has a discontinuous shape. For example, the second conductive pad 32 has a plurality of second grooves 323. In some embodiments, the ratio of the projection area A1 of the first groove 23 projected onto the substrate 11 to the projection area A2 of the first conductive pad 20 projected onto the substrate 11 is in a range from 0.05 to 0.95 ($0.05 \leq A1/A2 \leq 0.95$). In some embodiments, the ratio of the projection area A1 to the projection area A2 is in a range from 0.2 to 0.8 ($0.2 \leq A1/A2 \leq 0.8$). In some embodiments, the ratio of the projection area A1 to the projection area A2 is in a range from 0.4 to 0.6 ($0.4 \leq A1/A2 \leq 0.6$). In some embodiments, the ratio of the projection area A3 of the second groove 323 projected onto the substrate 11 to the projection area A4 of the second conductive pad 32 projected onto the substrate 11 is in a range from 0.05 to 0.95 ($0.05 \leq A3/A4 \leq 0.95$). In some embodiments, the ratio of the projection area A3 to the projection area A4 is in a range from 0.2 to 0.8 ($0.2 \leq A3/A4 \leq 0.8$). In some embodiments, the ratio of the projection area A3 to the projection area A4 is in a range from 0.4 to 0.6 ($0.4 \leq A3/A4 \leq 0.6$). In some embodiments, the projection areas or shapes of different first grooves 23 projected onto the substrate 11 may be the same or different. In some embodiments, the projection areas or shapes of different second grooves 323 projected onto the substrate 11 may be the same or different.

The first groove 23 of the first conductive pad 20 or the second groove 323 of the second conductive pad 32 are formed by a laser, a rotary cutter, a lithography process (such as exposure, development, or etching processes) or another suitable method, but it is not limited thereto.

Figure 4A:
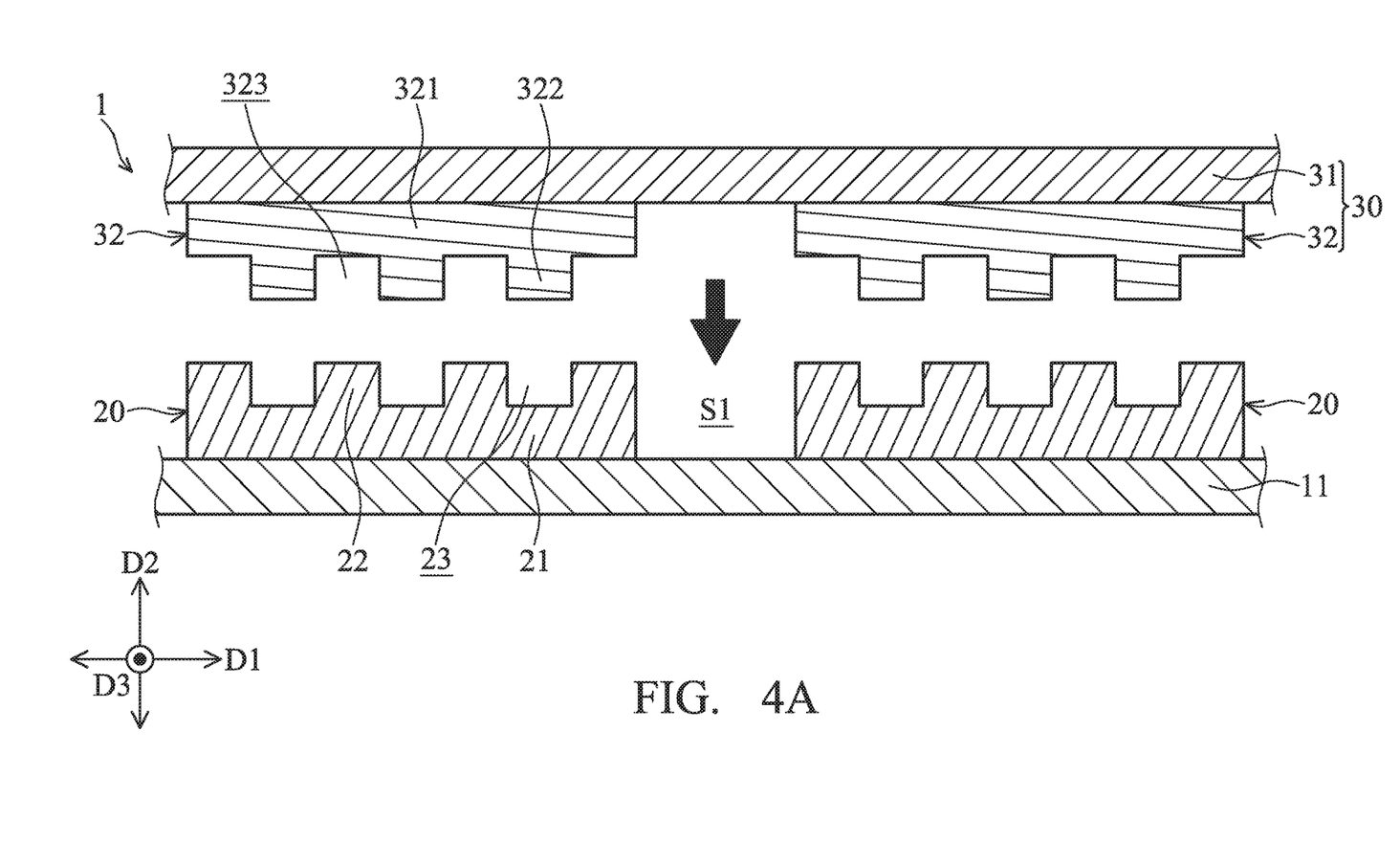
FIGS. 4A and 4B are process schematic views illustrating the manufacturing method of the electronic device in accordance with some embodiments of the present disclosure.
Figure 4B:
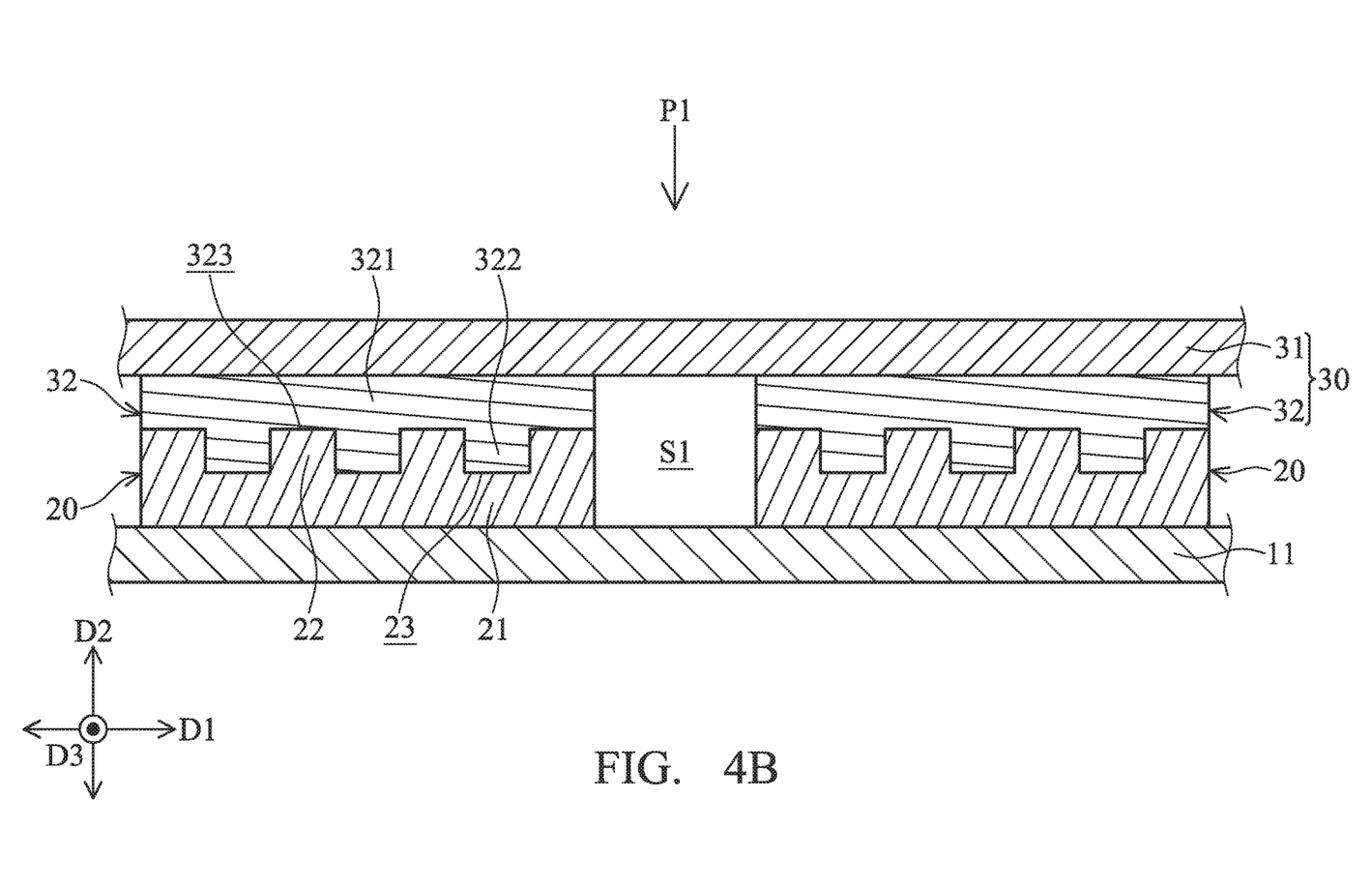

FIG. 4A and FIG. 4B are process schematic views illustrating an embodiment of the manufacturing method of the electronic device 1 in the present disclosure. As shown in FIG. 4A, the second conductive pad 32 of the chip 30 is aligned with the first conductive pad 20 of the substrate 11. In the above alignment, the second conductive pad 32 overlaps with the first conductive pad 20 in the normal direction D2 of the substrate 11. Subsequently, as shown in FIG. 4B, a part of the fourth portion 322 is disposed in the first groove 23, and a part of the second portion 22 is disposed in the second groove 323. In some embodiments, at least a portion of the first portion 21 is in contact with the fourth portion 322. In some embodiments, at least a portion of the second portion 22 is in contact with the third portion 321. Then, an appropriate pressure and/or an appropriate temperature is provided via a hot-pressing process P1 to bond the second conductive pad 32 to the first conductive pad 20 (e.g. fusion-bonding). In some embodiments, a solder alloy M is generated between the first conductive pad 20 and the second conductive pad 32 after bonding. The solder alloy M is an intermetallic compound (IMC), but it is not limited thereto. The material of the solder alloy M includes at least a portion of the material in the first conductive pad 20 and at least a portion of the material in the second conductive pad 32, but it is not limited thereto.

Figure 5:
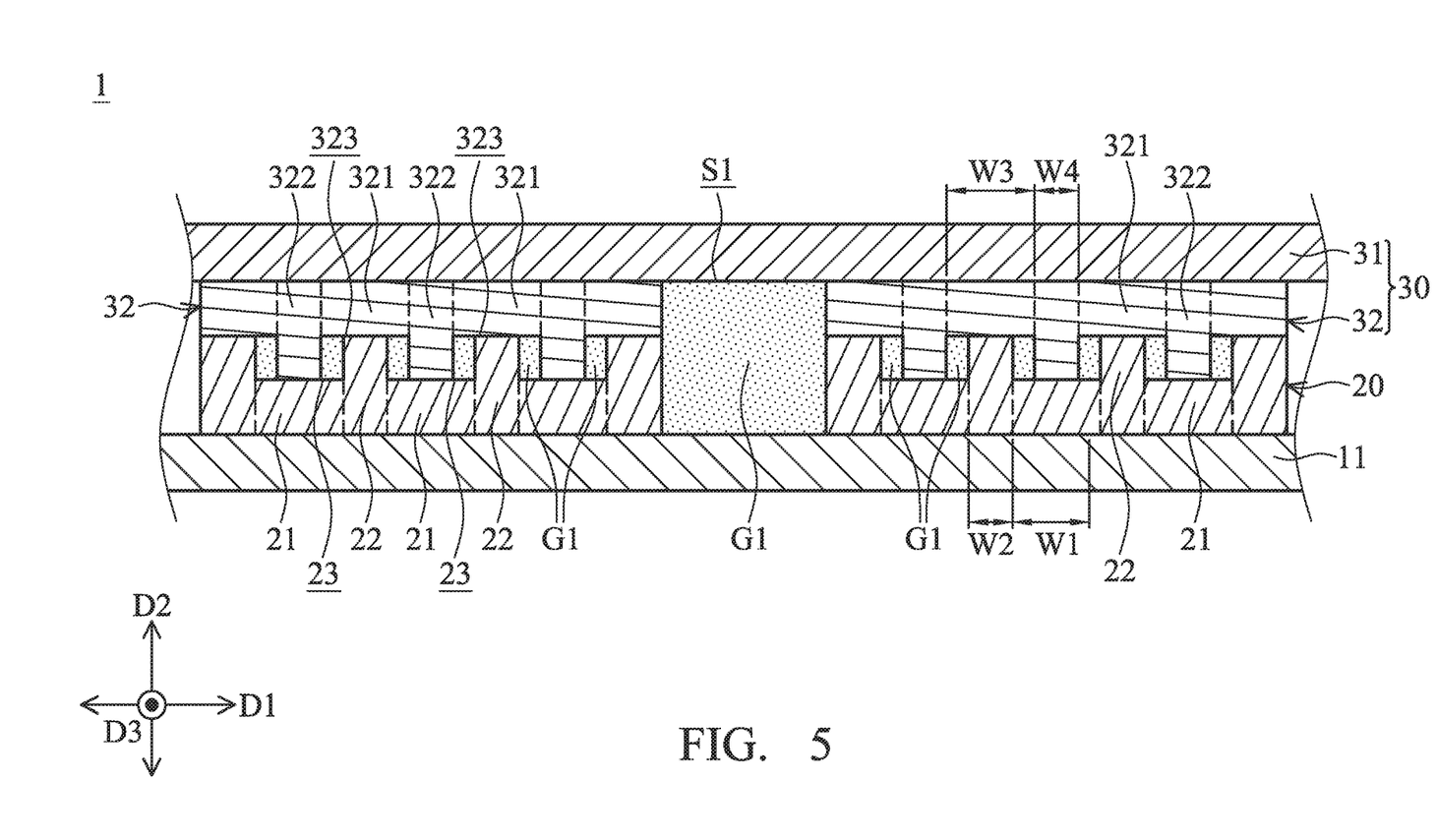
FIG. 5 is a schematic view illustrating the electronic device in accordance with a second embodiment of the present disclosure.

FIG. 5 is a schematic view of the electronic device 1 in accordance with a second embodiment of the disclosure. The second embodiment has a similar structure to the first embodiment shown FIG. 2. In the second embodiment, the electronic device 1 further includes an adhesive layer G1 disposed adjacent to the first conductive pad 20 and the second conductive pad 32, and the adhesive layer G1 is disposed between the first conductive pad 20 and the second conductive pad 32. In some embodiments, the adhesive layer G1 is disposed in the space S1, and the adhesive layer G1 includes an insulating adhesive material. In some embodiments, the material of the adhesive layer G1 includes a thermosetting polymer material or a thermoplastic polymer material. For example, epoxy resin or acrylic resin, acrylic polyol resin, other suitable materials or a combination thereof, but it is not limited thereto. In some embodiments, a plurality of first conductive pads 20 are disposed on the substrate 11, a plurality of second conductive pads 32, the plurality of second conductive pads 32 corresponds to the plurality of first conductive pads 20. A space S1 is formed between two adjacent of the plurality of first conductive pads 20 and two adjacent of the plurality of second conductive pads 32 after bonding. In some embodiments, the adhesive layer G1 is disposed in the space S1, but is not limited thereto. In some embodiments, there is air in the space S1. In some embodiments, the adhesive layer G1 is disposed in the first groove 23 and/or in the second groove 323.

In some embodiments (FIG. 5), the width W4 of the fourth portion 322 is less than the width W1 of the first portion 21. The adhesive layer G1 is disposed between the first conductive pad 20 and the second conductive pad 32, or the adhesive layer G1 is disposed in the space S1, even a portion of the adhesive layer G1 is disposed in the first groove 23 and/or in the second groove 323. As such, the bonding effect or adhesion between the chip 30 and the substrate 11 may be improved, or the conductivity between the chip 30 and the substrate 11 may be increased.

Figure 6A:
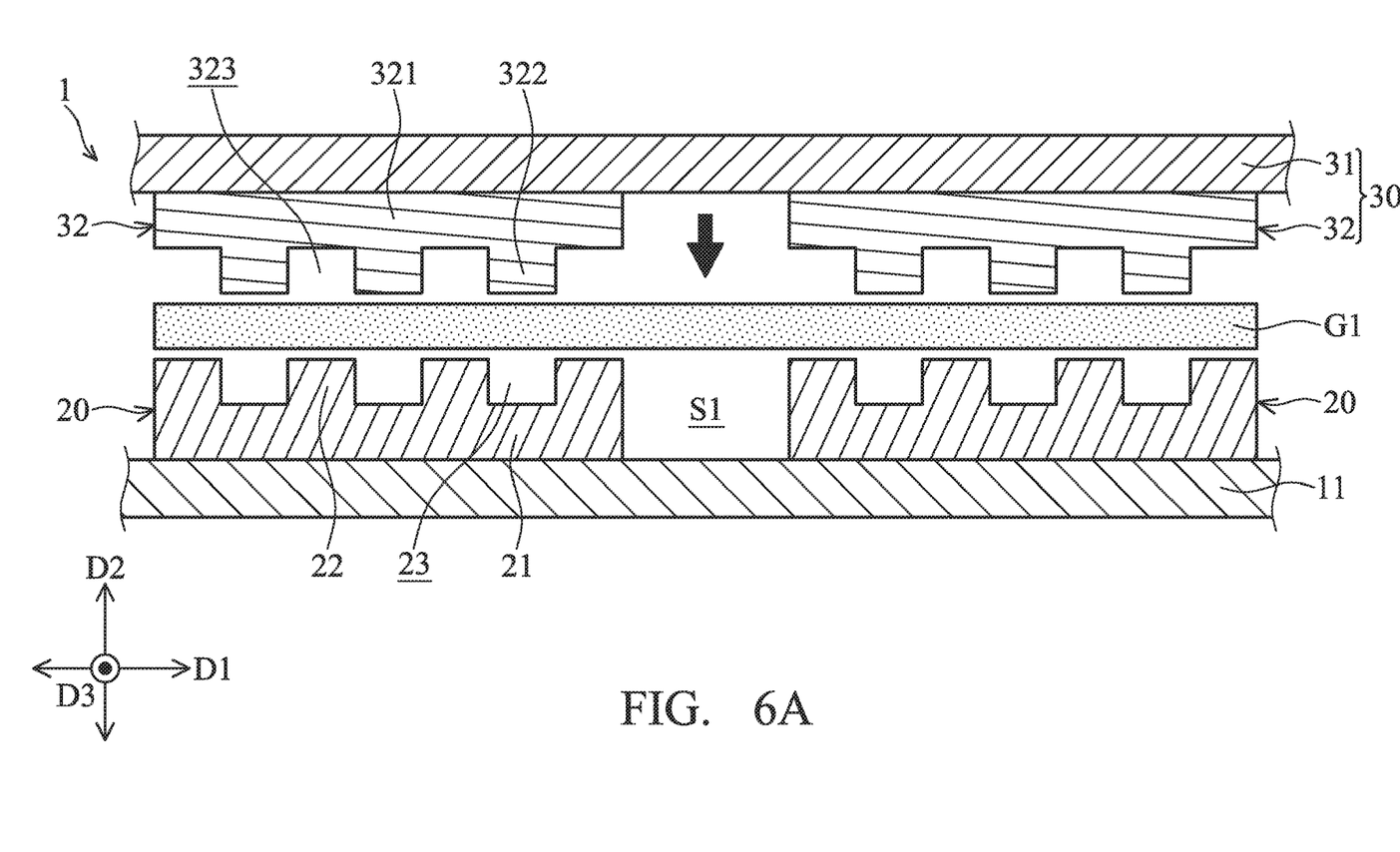
FIGS. 6A and 6B are process schematic views illustrating the manufacturing method of the electronic device in accordance with some other embodiments of the present disclosure.
Figure 6B:
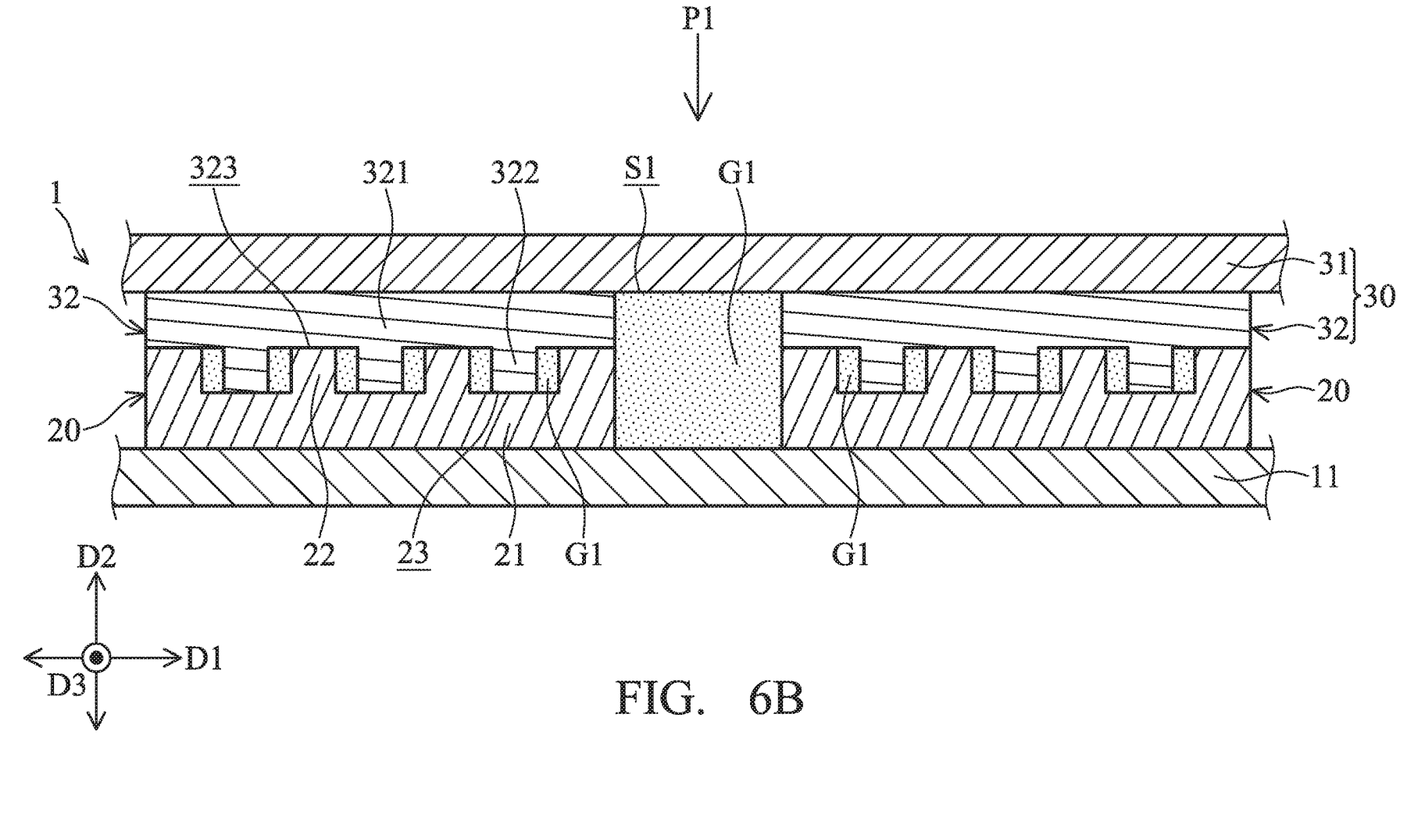

FIG. 6A and FIG. 6B are process schematic views illustrating another embodiment of the manufacturing method of the electronic device 1 in the present disclosure. As shown in FIG. 6A, before bonding, the adhesive layer G1 may be disposed on the first conductive pad 20 of the substrate 11, and then the second conductive pad 32 of the chip 30 is aligned with the first conductive pad 20. In the above alignment, the second conductive pad 32 overlaps with the first conductive pad 20 in the normal direction D2 of the substrate 11, and the adhesive layer G1 is disposed between the second conductive pad 32 and the first conductive pad 20 at this time. To be more specific, in an embodiment, the fourth portion 322 may correspond to the first groove 23, and the second portion 22 may correspond to the second groove 323. As shown in FIG. 6B, part of the fourth portion 322 is disposed in the first groove 23, and part of the second portion 22 is disposed in the second groove 323. In some embodiments, an appropriate pressure and/or an appropriate temperature is provided via the hot-pressing process P1 to bond the second conductive pad 32 to the first conductive pad 20. In the above embodiments of FIGS. 6A and 6B, the adhesive layer G1 may include an insulating adhesive material. When the adhesive layer G1 is disposed in the space S1, two adjacent first conductive pads 20 would not be electrically connected via the adhesive layer, and two adjacent second conductive pads 32 would not be electrically connected via the adhesive layer. In some embodiments, the adhesive layer G1 may have a material with buffering or supporting properties. The adhesive layer G1 may maintain an appropriate distance between the base 31 and the substrate 11 and reduce the possibility of inappropriate pressing between the base 31 and the substrate 11.

Figure 7:
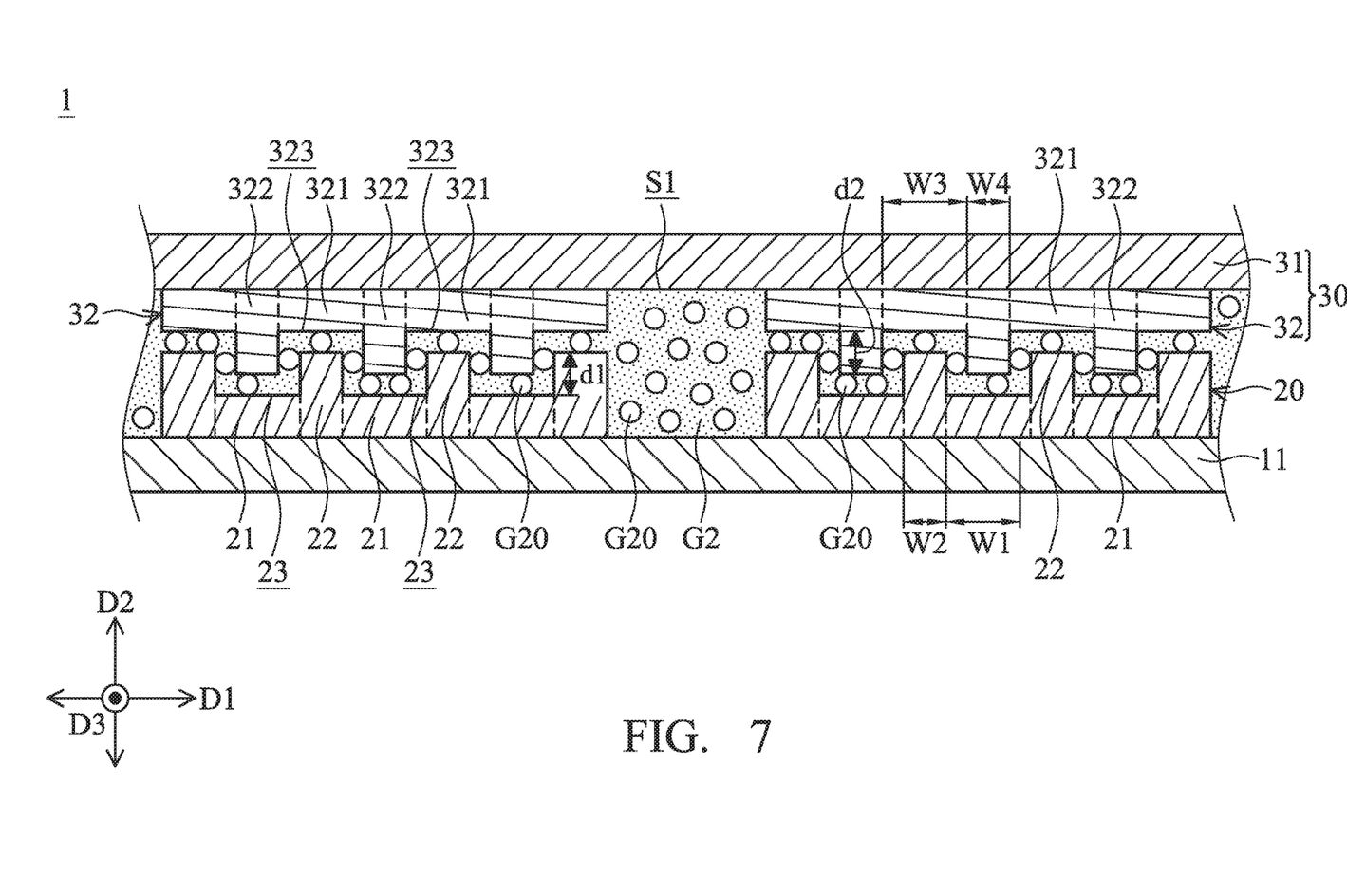
FIG. 7 is a schematic view illustrating the electronic device in accordance with a third embodiment of the present disclosure.

FIG. 7 is a schematic view illustrating the electronic device 1 in accordance with a third embodiment of the present disclosure. The third embodiment has a similar structure to the second embodiment shown in FIG. 5. In some embodiments, the adhesive layer G2 may include an anisotropic conductive adhesive or another conductive adhesive. In some embodiments, the adhesive layer G2 is disposed in the space S1. In some embodiments, the adhesive layer G2 may be disposed in the first groove 23 and/or in the second groove 323. In the embodiment of FIG. 7, the adhesive layer G2 includes a plurality of conductive particles G20. The conductive particles G20 may be disposed between the first conductive pad 20 and the second conductive pad 32. The first conductive pad 20 may be electrically connected to the second conductive pad 32 via the conductive particles G20. In some embodiments, the material of the conductive particles G20 includes gold, nickel, silver, copper, tin, other suitable metal materials, alloys thereof, other suitable conductive materials or any combination thereof, but it is not limited thereto. In some embodiments, the maximum width of the conductive particles G20 may be less than the width W1 of the first portion 21 (or the width of the first groove 23), or the maximum width of the conductive particles G20 may be less than the width W3 of the third portion 321 (or the width of the second groove 323). In some embodiments, the maximum width of the conductive particles G20 may be less than the depth d1 of the first groove 23, or the maximum width of the conductive particles G20 may be less than the depth d2 of the second groove 323. Therefore, the adhesive layer G2 may improve the bonding effect or adhesion between the chip 30 and the substrate 11 or increase the electrical conductivity between the chip 30 and the substrate 11.

Figure 8A:
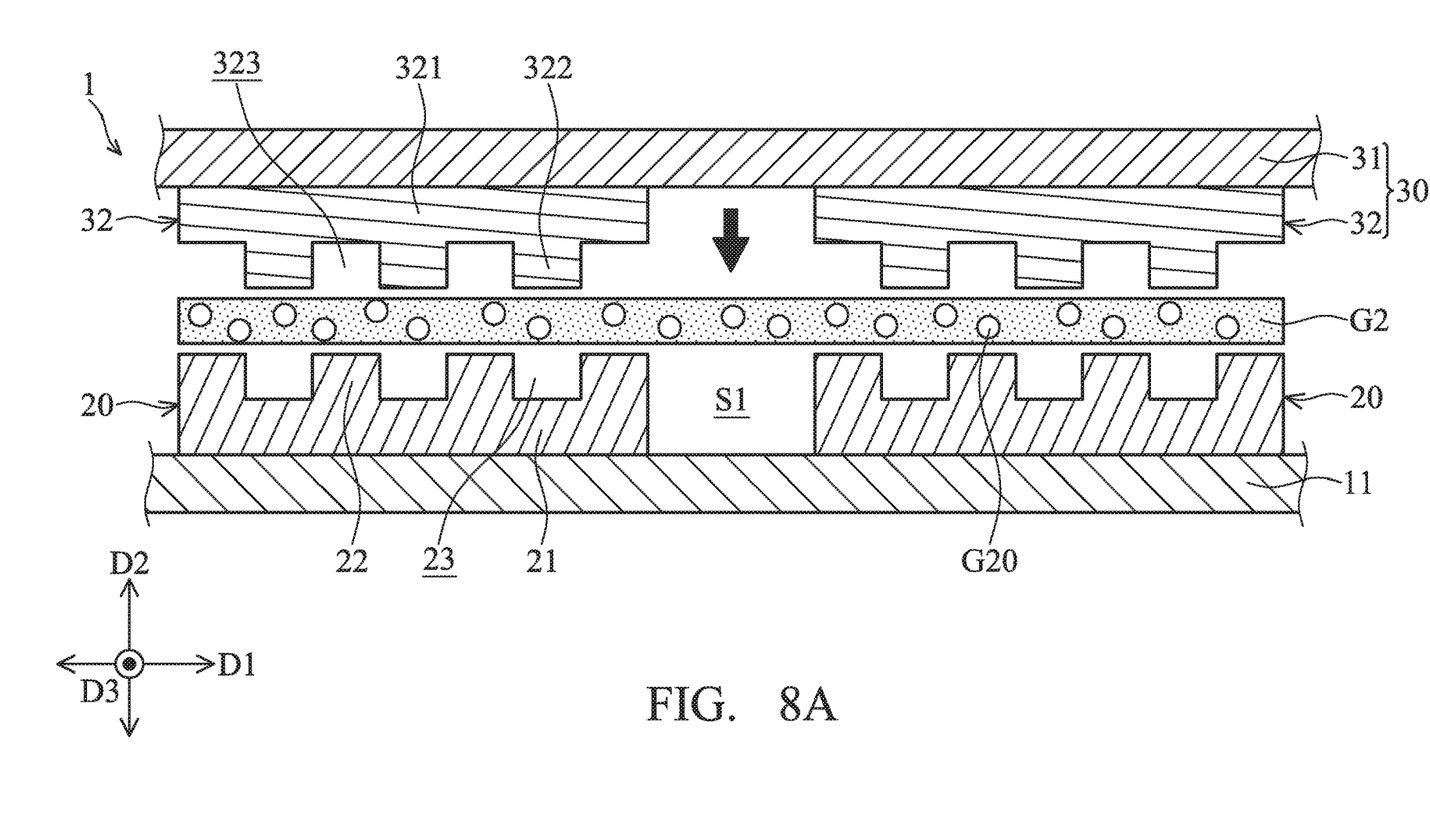
FIGS. 8A and 8B are process schematic views illustrating the manufacturing method of the electronic device in accordance with some other embodiments of the present disclosure.
Figure 8B:
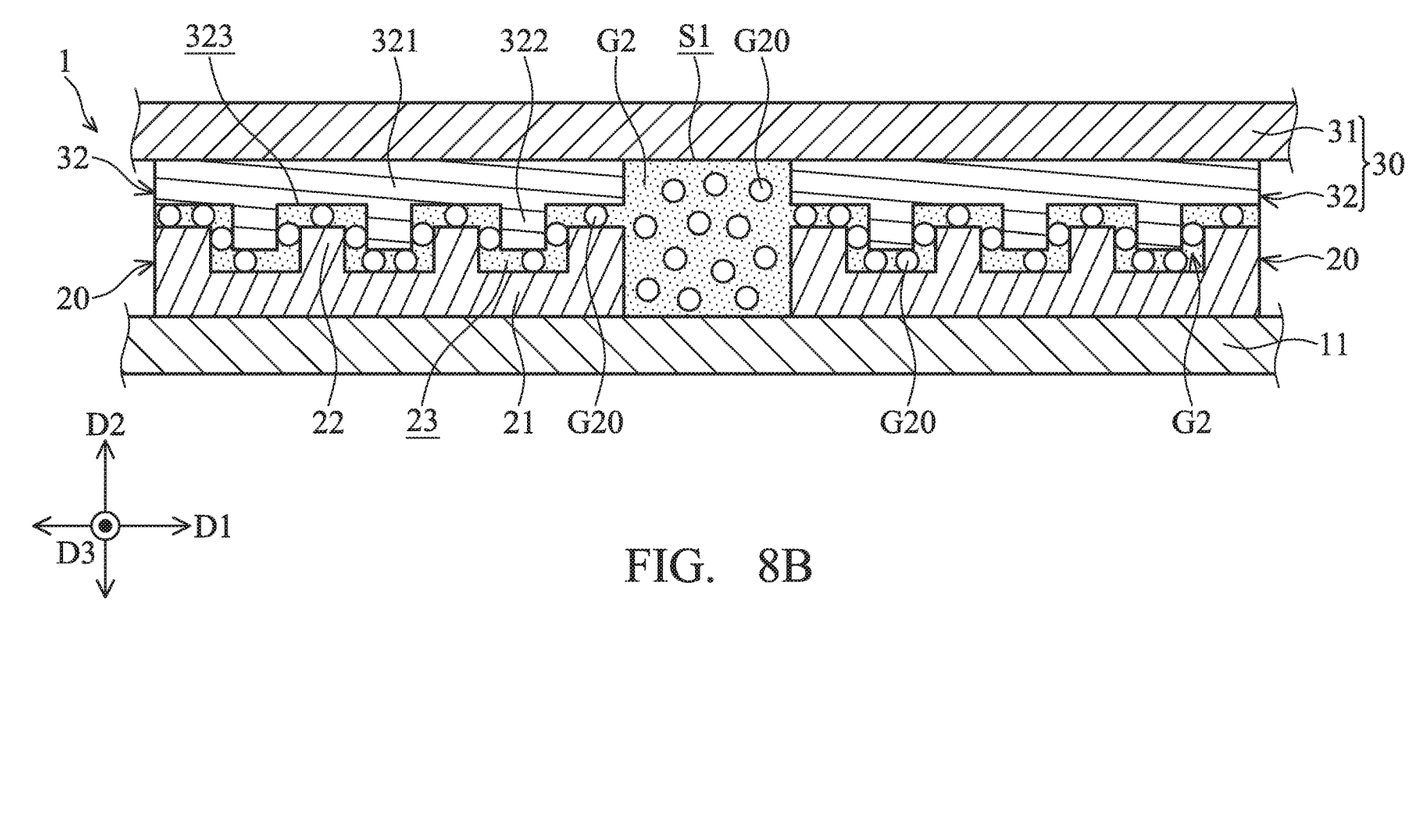

FIG. 8A and FIG. 8B are process schematic views illustrating another embodiment of the manufacturing method of the electronic device 1 in the present disclosure. As shown in FIG. 8A, before bonding, for example, the adhesive layer G2 may be disposed on the first conductive pad 20 of the substrate 11, and then the second conductive pad 32 of the chip 30 is aligned with the first conductive pad 20. For example, the second conductive pad 32 overlaps with the first conductive pad 20 in the normal direction D2 of the substrate 11, and the adhesive layer G2 is disposed between the second conductive pad 32 and the first conductive pad 20. In detail, in an embodiment, the fourth portion 322 corresponds to the first groove 23, and the second portion 22 corresponds to the second groove 323. As shown in FIG. 8B, the fourth portion 322 is disposed in the first groove 23, and the second portion 22 is disposed in the second groove 323. In some embodiments, the second conductive pad 32 and the first conductive pad 20 are bonded by providing an appropriate pressure and/or an appropriate temperature via the hot pressing process P1.

These disclosed features may be combined, modified, replaced, or switched with one or more disclosed embodiments in any suitable manner, and are not limited to specific embodiments.

Some embodiments in the present disclosure provide some advantages that are better than the prior art. However, it should be appreciated that other embodiments may also provide different advantages. All of these advantages are not necessary to be discussed in the present disclosure, and there is no particular advantage that needs to be present in all the embodiments. Multiple advantages may be present in some embodiments.

As set forth above, the chip of the electronic device in the present disclosure may be bonded to the substrate by the first conductive pad. In addition, the chip may be disposed on the substrate more stably by the structural design of the first conductive pad and the second conductive pad, and/or the conductivity between the chip and the first conductive pad may be increased.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure, as long as substantially the same function or result may be obtained as that in the above embodiments based on the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising: a substrate; a first conductive pad disposed on the substrate; a chip comprising a second conductive pad electrically connected to the first conductive pad, wherein the first conductive pad is disposed between the substrate and the second conductive pad; wherein the first conductive pad has a first groove; a conductive particle, wherein a maximum width of the conductive particle is less than a width of the first groove; and wherein the second conductive ad has a second groove, and the first groove does not overlap with the second groove in a normal direction of the substrate.

2. The electronic device as claimed in claim 1, wherein the first conductive pad has a first portion and a second portion, the first groove overlaps with the first portion in the normal direction of the substrate, and the second groove overlaps with the second portion in the normal direction of the substrate.

3. The electronic device as claimed in claim 2, wherein the second portion is disposed in the second groove.

4. The electronic device as claimed in claim 2, wherein a width of the second portion is less than a width of the second groove.

5. The electronic device as claimed in claim 1, wherein the second conductive pad has a third portion and a fourth portion, the second groove overlaps with the third portion in the normal direction of the substrate, and the first groove overlaps with the fourth portion in the normal direction of the substrate.

6. The electronic device as claimed in claim 5, wherein the fourth portion is disposed in the first groove.

7. The electronic device as claimed in claim 5, wherein a width of fourth portion is less than a width of the first groove.

8. The electronic device as claimed in claim 5, wherein a projection area of the fourth portion projected onto the substrate is less than a projection area of the first groove projected onto the substrate.

9. The electronic device as claimed in claim 2, wherein a ratio of a depth of the first groove to a thickness of the second portion is in a range from 0.1 to 1.

10. The electronic device as claimed in claim 1, further comprising an adhesive layer disposed between the first conductive pad and the second conductive pad, and the adhesive layer is disposed in the first groove or the second groove.

11. The electronic device as claimed in claim 1, wherein the maximum width of the conductive particle is less than a depth of the first groove.

12. The electronic device as claimed in claim 1, comprising:
   a plurality of first conductive pads disposed on the substrate; and
   a plurality of second conductive pads, wherein the plurality of second conductive pads corresponds to the plurality of first conductive pads, and a space is formed between two adjacent ones of the plurality of first conductive pads and two adjacent ones of the plurality of second conductive pads.

13. The electronic device as claimed in claim 12, further comprising an adhesive layer disposed in the space, wherein the adhesive layer comprises an insulating adhesive material.

14. The electronic device as claimed in claim 1, wherein the first groove has a discontinuous shape.

15. The electronic device as claimed in claim 1, wherein the first groove faces the second conductive pad.

16. The electronic device as claimed in claim 1, wherein a ratio of a projection area of the first groove projected onto the substrate to a projection area of the first conductive pad projected onto the substrate is in a range from 0.05 to 0.95.

17. The electronic device as claimed in claim 1, wherein a structure of the first conductive pad is complementary to a structure of the second conductive pad.

18. The electronic device as claimed in claim 1, wherein the first conductive pad is aligned with the second conductive pad.

* * * * *